(12) United States Patent
Arimoto et al.

(10) Patent No.: US 8,179,931 B2
(45) Date of Patent: May 15, 2012

(54) WAVELENGTH TUNABLE FILTER AND WAVELENGTH TUNABLE LASER MODULE

(75) Inventors: Hideo Arimoto, Kodaira (JP); Masahiro Aoki, Kokubunji (JP)

(73) Assignee: Opnext Japan, Inc., Yokohama (JP)

( * ) Notice: Subject to any disclaimer, the term of this patent is extended or adjusted under 35 U.S.C. 154(b) by 40 days.

(21) Appl. No.: 12/622,785

(22) Filed: Nov. 20, 2009

(65) Prior Publication Data
US 2010/0142568 A1 Jun. 10, 2010

(30) Foreign Application Priority Data
Nov. 25, 2008 (JP) ................................ 2008-298930

(51) Int. Cl.
*H01S 3/10* (2006.01)
(52) U.S. Cl. ...... 372/20; 372/50.1; 372/50.11; 372/102; 372/108; 385/9; 385/10; 385/37
(58) Field of Classification Search .............. 372/20, 372/50.1, 50.11, 102, 108; 385/9, 10, 37
See application file for complete search history.

(56) References Cited

U.S. PATENT DOCUMENTS
| | | | | |
|---|---|---|---|---|
| 6,487,227 | B1 * | 11/2002 | Kuramachi | 372/49.01 |
| 6,810,058 | B2 * | 10/2004 | Wesstrom | 372/50.1 |
| 7,106,765 | B2 * | 9/2006 | Carter et al. | 372/20 |

FOREIGN PATENT DOCUMENTS
| | | |
|---|---|---|
| JP | 2000-223774 A | 8/2000 |
| JP | 2005-327881 A | 11/2005 |
| JP | 2005327881 A * | 11/2005 |

OTHER PUBLICATIONS
P. Rigole et al., 114-nm Wavelength Tuning Range of a Vertical Grating Assisted Codirectional Coupler Laser with a Super Structure Grating Distributed Bragg Reflector, IEEE Photonics Technology Letters, vol. 7, No. 7, Jul. 1995, pp. 697-699.

* cited by examiner

*Primary Examiner* — Yuanda Zhang
(74) *Attorney, Agent, or Firm* — Mattingly & Malur, PC

(57) ABSTRACT

A wavelength tunable filter and a wavelength tunable laser module are a codirectional coupler type whose characteristics do not vary significantly with a process error. They are structured so as to include a semiconductor substrate which has a first optical waveguide and a second optical waveguide. The first and the second optical waveguides are extended from a first side of the semiconductor substrate to an opposing second side thereof. The first optical waveguide includes a first core layer, which has a planar layout having periodic convexes and concaves, and a pair of electrodes, which vertically sandwich the first core layer. The second optical waveguide includes a second core layer, which has a lower refractive index than the first core layer. Further, a layer having the same composition and film thickness as the second core layer is placed under the first core layer.

7 Claims, 10 Drawing Sheets

LIGHT HAVING WAVELENGTH OF λ

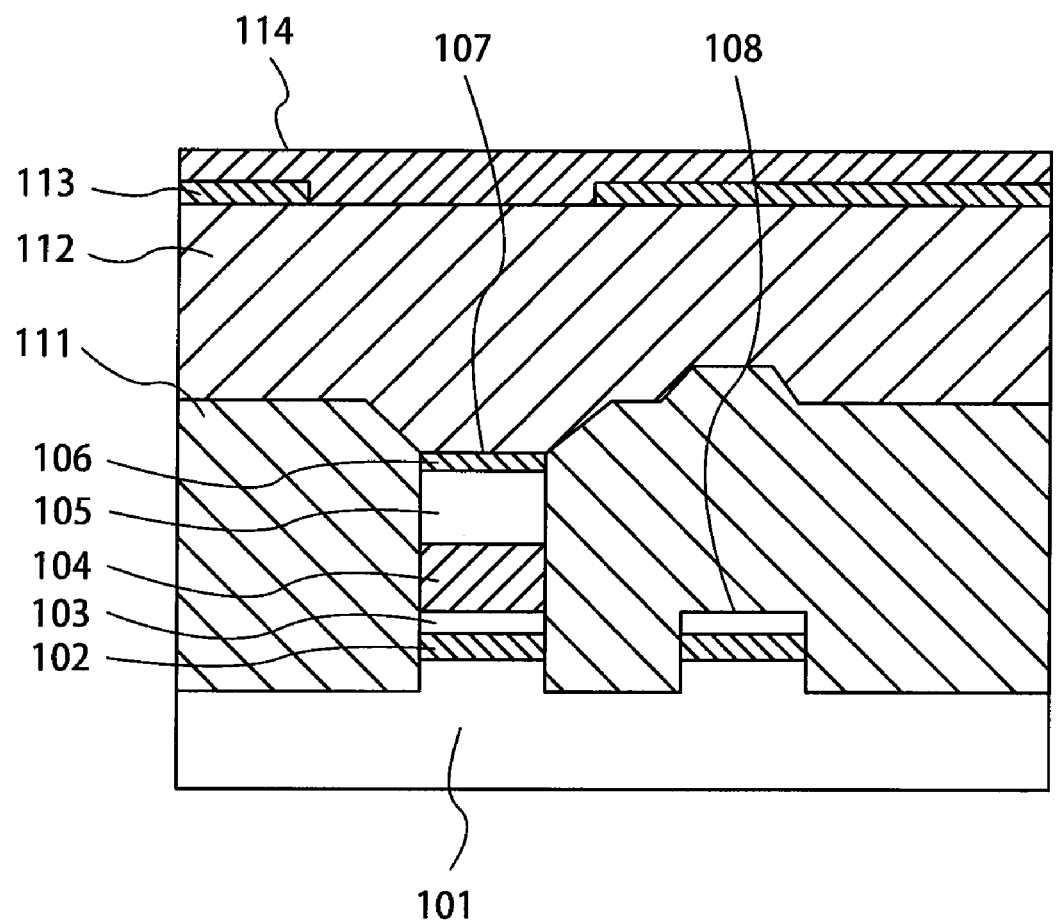

WAVELENGTH TUNABLE FILTER AND WAVELENGTH TUNABLE LASER MODULE

CLAIM OF PRIORITY

The present application claims priority from Japanese patent application JP 2008-298930 filed on Nov. 25, 2008, the content of which is hereby incorporated by reference into this application.

BACKGROUND OF THE INVENTION

1. Field of the Invention

The present invention relates to a wavelength tunable laser module and a wavelength tunable filter.

2. Description of the Related Art

The transmission capacity of optical communication systems has been increasing year by year. In response to such a transmission capacity increase, a wavelength-division multiplexing (WDM) technology is put to practical use as a technology for providing high-speed, large-capacity optical communication at a low cost. The WDM technology makes it possible to simultaneously use many monochromatic light waves (several dozen to one hundred wavelengths) that differ in frequency by 50 GHz or 100 GHz, and transmit different signals at various wavelengths. Further, the use of the WDM technology significantly reduces the cost of optical fiber installation because it increases the transmission capacity of a single fiber by more than several tens of times.

Previously used WDM light sources were such that multiple modules, which were obtained by placing a semiconductor laser element within a housing and connecting its driving semiconductor IC and wiring to it, were required for various wavelengths.

To manufacture a laser, it was necessary to produce a crystal for each wavelength. Further, the module had to be manufactured for each wavelength. This caused a problem of increased cost. To address such a problem, a wavelength tunable module was developed to make it possible to vary the wavelength as desired. As the wavelength tunable module is capable of varying the light wavelength in a range of about 40 nm, it reduces the number of required semiconductor lasers and makes it possible to offer it at a low cost. Therefore, the wavelength tunable module is now used as a major WDM light source.

Various methods were studied for use with a wavelength tunable laser. As an example, a GCSR (Grating assisted Codirectional coupler laser with rear Sampled grating Reflector) will now be described with reference to IEEE Photonics Technology Letters, Vol. 7, No. 7, July 1995, pp. 697-699. FIG. 1 is a cross-sectional view illustrating the structure of a GCSR laser. FIG. 2 is a spectrum illustrating the operating principle of the GCSR laser. This laser is configured so that a reflector with grating structure 12, a phase control region 13, a codirectional coupler 14, and a gain region 15 are optically connected. These regions are delimited in accordance with the arrangement of electrodes 7, 8, 9, and 10.

A striped low-refractive-index waveguide layer 2 is placed in the reflector with grating structure 12, the phase control region 13, and the codirectional coupler 14, which are on an n-type InP substrate 1. A striped gain layer (luminescent layer) 4 is placed in the gain region 15. On top of the low-refractive-index waveguide layer 2, a high-refractive-index waveguide layer 3 is placed in the reflector with grating structure 12, the phase control region 13, and the codirectional coupler 14 via a p-type clad layer. Further, on top of the high-refractive-index waveguide layer 3, via a p-type clad layer, a grating layer 5 is placed in the reflector with grating structure 12, a p-type clad layer is placed in the phase control region 13, and a long-period grating 6 is placed in the codirectional coupler 14. Again, on top of such layers, via a p-type clad layer, the electrodes 7, 8, 9, and 10, which are separated from each other to match the reflector with grating structure 12, the phase control region 13, the codirectional coupler 14, and the gain region 15, respectively, are formed as mentioned earlier. Furthermore, below the n-type InP substrate, a common electrode 11 is placed to cover all the above-mentioned regions (the reflector with grating structure 12, the phase control region 13, the codirectional coupler 14, and the gain region 15).

The low-refractive-index waveguide layer 2 and the high-refractive-index waveguide layer 3 are equal in length and extended into the gain region 15 (to a position that overlaps with an end of the electrode 10). More specifically, the employed structure is such that the start point 18 of the high-refractive-index waveguide layer is the same as the start point 19 of the low-refractive-index waveguide layer, and that the start point 17 of the long-period grating is positioned inside.

As shown in FIG. 2, laser oscillation occurs in a longitudinal mode 33 in the vicinity of a wavelength at which the peak of a transmission spectrum 31 of the codirectional coupler coincides with the peak of a reflection spectrum 32 of the reflector with grating structure. The transmission spectrum 31 of the codirectional coupler and the reflection spectrum 32 of the reflector with grating structure can be adjusted by means of current injection to vary the wavelength of laser oscillation 34.

There is the following problem with the above-described laser. The reflector with grating structure 12, the phase control region 13, and the codirectional coupler 14 can be formed by the same process until a grating formation layer is reached. However, the gain region 15 is an entirely different structure that has to be formed by a different process. The reason is that the gain region 15, which gives priority to luminous efficiency, differs in functionality from an optical waveguide, which gives priority to optical confinement efficiency. As the longitudinal structures completely differ from each other as described above, it is difficult to connect the gain layer 4 to the low-refractive-index waveguide layer 2 with high accuracy. In reality, the n-type InP 1 is 0.9 µm in thickness, the high-refractive-index waveguide layer 3 is 0.34 µm in thickness, and the low-refractive-index waveguide layer 2 is 0.2 µm in thickness. Therefore, if the gain layer 4 is first grown to eliminate an unnecessary portion, and then the n-type InP 1, the high-refractive-index waveguide layer 3, and the low-refractive-index waveguide layer 2 are regrown, the low-refractive-index waveguide layer 2 cannot be smoothly connected to the gain layer 4 due to significant difference in thickness. This is also true in a case where the order of growth is reversed.

A wavelength tunable filter that addresses the above problem is disclosed in Japanese Patent Application Laid-Open Publication No. 2005-327881. FIG. 3 is a bird's-eye view illustrating the structure of the wavelength tunable filter disclosed in Japanese Patent Application Laid-Open Publication No. 2005-327881. The structure shown in FIG. 3 includes a low-refractive-index waveguide layer and a high-refractive-index waveguide layer, which are formed on the surface of a substrate and extended in parallel with each other (this structure is referred to as the lateral codirectional coupler). As shown in FIG. 3, a left-hand waveguide layer 42 and a right-hand waveguide layer 43 are formed on a substrate 41. Further, a left-hand waveguide 44 and a right-hand waveguide 45, in which a long-period grating 46 is formed, are formed in the substrate and positioned in parallel with each other. This wavelength tunable filter functions as a wavelength selection filter because only a particular wavelength λ is allowed to move between the left-hand waveguide layer 42 and right-hand waveguide layer 43. Forming the wavelength selection filter in this manner reduces the level difference between the optical waveguides and makes it possible to establish a smooth connection to a gain region (not shown).

A wavelength tunable laser that addresses the aforementioned problem is disclosed in Japanese Patent Application Laid-Open Publication No. 2000-223774. The wavelength tunable laser disclosed in Japanese Patent Application Laid-Open Publication No. 2000-223774 is configured so that a gain region is sandwiched between a Mach-Zehnder interferometer filter and an SSG-DBR filter.

SUMMARY OF THE INVENTION

Paragraph 0039 of Japanese Patent Application Laid-Open Publication No. 2005-327881 states that "the left-hand waveguide 705 includes a refractive index control electrode 140 so that a current input through a refractive index control electrode 140 enters the left-hand waveguide 705 of the GaCC wavelength tunable filter 120." In other words, it is disclosed that a refractive index control electrode is formed on the left-hand waveguide 44 shown in FIG. 3. However, the other disclosed optical waveguide structures are limited to those which are formed by employing a high-mesa ridge structure (refer to paragraph 0040 of Japanese Patent Application Laid-Open Publication No. 2005-327881), by providing two optical waveguides with a grating (refer to paragraph 0040 of Japanese Patent Application Laid-Open Publication No. 2005-327881), by providing the middle layers of two optical waveguides with a grating (refer to paragraph 0040 of Japanese Patent Application Laid-Open Publication No. 2005-327881), by making the width of a ridge portion including two optical waveguides different from its height (refer to paragraph 0037 of Japanese Patent Application Laid-Open Publication No. 2005-327881), by providing the upper surface of an optical waveguide with a grating (refer to paragraph 0040 of Japanese Patent Application Laid-Open Publication No. 2005-327881), or by making the compositions of two optical waveguides identical with each other or different from each other (refer to paragraph 0041 of Japanese Patent Application Laid-Open Publication No. 2005-327881).

More specifically, Japanese Patent Application Laid-Open Publication No. 2005-327881 does not describe the structure of the right-hand waveguide 45 or the structure formed above the right-hand waveguide 45.

The most common method of making the composition of an optical waveguide different from the others is to connect a crystal having a different composition by means of a butt joint. To permit a codirectional coupler to operate, it is necessary to ensure that the distance between the left-hand waveguide 44 and right-hand waveguide 45 does not exceed 2 μm. However, the use of a butt joint, which is based on selective growth, makes it difficult to control the composition of a portion near the optical waveguide. Further, a problem arises because filtration characteristics vary depending on the positional relationship between a boundary 47 between the right- and left-hand waveguide layers, the left-hand waveguide 44, and the right-hand waveguide 45.

Furthermore, there is another problem with the codirectional coupler 14 of the GCSR laser shown in FIG. 1. More specifically, the transmission spectral characteristics of the codirectional coupler may vary in accordance with subtle structural changes. The reason is that when light passing through the gain region 15 is incident on the codirectional coupler 14, the start point 17 of the long-period grating and the start point 18 of the high-refractive-index waveguide layer change their positions to change the phase of the light incident on the codirectional coupler. Particularly, as the high-refractive-index waveguide layer 3 emerges suddenly, it is difficult to exercise relevant control. Japanese Patent Application Laid-Open Publication No. 2005-327881 does not describe a solution to the above problem.

The present invention has been made in view of the above circumstances and provides a wavelength tunable filter and a wavelength tunable laser that are of a codirectional coupler type whose characteristics do not significantly vary with a process error.

The Mach-Zehnder interferometer filter described in Japanese Patent Application Laid-Open Publication No. 2000-223774 is such that its filtration characteristics become smoothed when an attempt is made to enlarge the wavelength tuning range. It is therefore difficult to change the wavelength in a so-called C band (having a wavelength between 1530 nm and 1570 nm) and achieve single-mode oscillation.

To provide a method of addressing the above-described problems, the present invention has disclosed the structure of a lateral codirectional coupler type wavelength tunable filter, as described below.

FIG. 4 is a perspective view illustrating a structure that addresses the first problem (the method of forming lateral codirectional couplers having different compositions). An n-type InP substrate includes a high-refractive-index waveguide 60 and a low-refractive-index waveguide 61. The high-refractive-index waveguide 60 is structured by stacking optical waveguide layer A 53, n-type InP 54, optical waveguide layer B 55, and p-type InP 56. The low-refractive-index waveguide 61, on the other hand, is structured by stacking optical waveguide layer A 53, n-type InP 54, semi-insulating InP 52, and p-type InP 56. This structure permits proximity arrangement because it forms parallel optical waveguides having different refractive indices by using a wet etching process instead of a butt joint based on selective growth. As the high-refractive-index waveguide 60 and the low-refractive-index waveguide 61 both include a laminate containing optical waveguide layer A 53 and n-type InP 54, formation can be achieved by successively growing a portion between optical waveguide layer A 53 and P-type InP 56, and then selectively removing optical waveguide layer B 55 and p-type InP 56, which constitute the low-refractive-index waveguide 61. Further, a butt joint based on selective growth can be eliminated from a portion between the high-refractive-index waveguide 60 and the low-refractive-index waveguide 61. This makes it possible to suppress a decrease in the controllability of composition, which is caused by selective growth. Consequently, a wavelength tunable filter having stable characteristics can be implemented.

Furthermore, as the upper surface of the low-refractive-index waveguide 61 is covered with semi-insulating InP 52, it is possible to efficiently inject a current into the high-refractive-index waveguide having a long-period grating. This increases a rate of wavelength change by current injection.

Moreover, as the upper surface of the low-refractive-index waveguide 61 is not only covered with semi-insulating InP 52 but also provided with an inorganic insulation film, no current directly flows to the low-refractive-index waveguide 61. Therefore, an electrode can be placed on the low-refractive-index waveguide 61. As the electrode can be freely positioned as mentioned above, an electrical connection with the outside can be established with ease. This provides an advantage of being able to suppress the positional displacement of a junction area for junk-down implementation and of an installed optical semiconductor element.

FIG. 5 is a top view illustrating a structure that addresses the second problem (in which the transmission spectral characteristics of the codirectional coupler vary in accordance with subtle structural changes). Light falls on a linear portion 72 of the high-refractive-index waveguide. In this instance, the low-refractive-index waveguide has a curved structure (curved portion 74) and is positioned sufficiently apart from the linear portion 72 of the high-refractive-index waveguide. In a region where a long-period grating 77 is formed as the low-refractive-index waveguide gradually approaches due to its curved structure, its distance from the high-refractive-index waveguide is not longer than 2 µm, for example, approximately 1 µm so that a codirectional coupler is formed. At a place near a point of light emission, the high-refractive-index waveguide 72 gradually moves away from the low-refractive-index waveguide 75. At the point of light emission, the low-refractive-index waveguide 75 is positioned sufficiently apart from the high-refractive-index waveguide 72. The use of this structure addresses a problem with the codirectional coupler of the GCSR laser in which the high-refractive-index waveguide layer suddenly emerges. In addition, the pattern of the long-period grating 77 can be formulated together with those of the high-refractive-index waveguide 72 and low-refractive-index waveguide 75 by using the same mask. This makes it possible to address another problem with the codirectional coupler of the GCSR laser, or more specifically, to prevent the characteristics from significantly varying depending on the positional relationship between the start point 17 of the long-period grating 6 and the start point 18 of the high-refractive-index waveguide layer.

The use of the above-described approach makes it possible to provide a wavelength tunable filter and a wavelength tunable laser that are of a codirectional coupler type whose characteristics do not significantly vary.

BRIEF DESCRIPTION OF THE DRAWINGS

Embodiments of the present invention will be described in detail based on the following figures, wherein:

FIG. 6F is a flow diagram illustrating how a lateral codirectional coupler type wavelength tunable filter is manufactured;

DESCRIPTION OF THE PREFERRED EMBODIMENTS

First Embodiment

Figure 4:
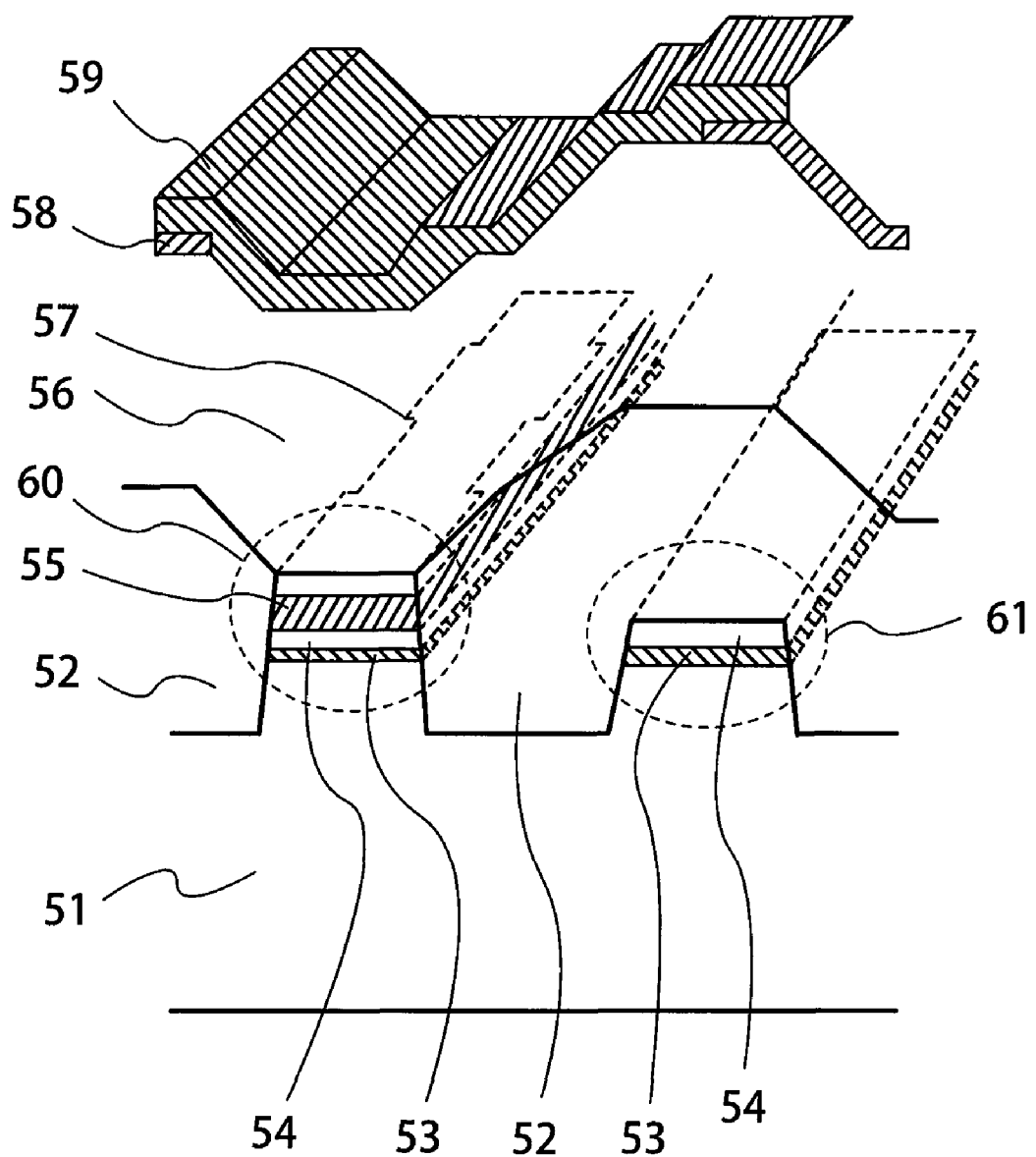
FIG. 4 is a partial perspective view illustrating a lateral codirectional coupler type wavelength tunable filter.
Figure 5:
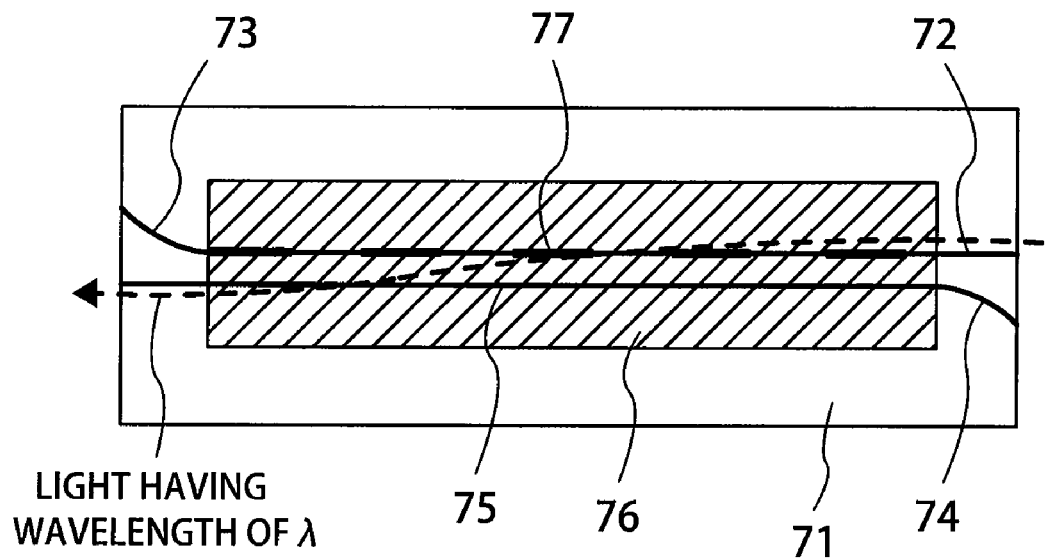
FIG. 5 is a top view illustrating the configuration of a lateral codirectional coupler type wavelength tunable filter.

A first embodiment of the present invention will now be described with reference to FIGS. 4, 5, 6A, 6B, 6C, 6D, 6E, and 6F. The first embodiment is a 1.55 µm band, lateral codirectional coupler type wavelength tunable filter mounted on an InP substrate. FIG. 4 is a partial perspective view illustrating the lateral codirectional coupler type wavelength tunable filter according to the present embodiment. FIG. 5 is a top view illustrating the configuration of the lateral codirectional coupler type wavelength tunable filter according to the present embodiment. The layout of the lateral codirectional coupler type wavelength tunable filter will be described in detail below.

The lateral codirectional coupler type wavelength tunable filter according to the present embodiment is configured so that two optical waveguides (a high-refractive-index waveguide 60 and a low-refractive-index waveguide 61) are arranged in plane with a 1 µm gap in between. As indicated by a planar layout shown in FIG. 5, the high-refractive-index waveguide 60 and low-refractive-index waveguide 61 are substantially parallel to each other and composed of a mesa-striped semiconductor, which is extended parallel between their opposing sides.

As indicated by the partial cross-sectional view in FIG. 4, the high-refractive-index waveguide 60 is composed of a laminate, which is formed by sequentially stacking optical waveguide layer A 53, n-type InP 54, optical waveguide layer B 55, and p-type InP 56 on top of a left-hand convex of n-type InP 51. An underside electrode (not shown) is formed on the underside of the n-type InP 51. The high-refractive-index waveguide 60 has a laterally periodic, rectangular, plane pattern (a pattern in which the optical waveguide width periodically changes) along a wave guiding direction so that each of the left-hand convex of n-type InP 51, optical waveguide layer A 53, n-type InP 54, and optical waveguide layer B 55 is a long-period grating 57.

As indicated by the reference numerals 72 and 73 in FIG. 5, the high-refractive-index waveguide 60 is linear at the center of the lateral codirectional coupler type wavelength tunable filter (at the center of the low-refractive-index waveguide 61), positioned apart from the low-refractive-index waveguide 61 at one end of the lateral codirectional coupler type wavelength tunable filter (at an end of the low-refractive-index waveguide 61), and curved in the direction of an increasing gap (positioned to gradually approach the low-refractive-index waveguide 61 toward the center) to have a planar layout. To indicate this planar layout, FIG. 5 shows a linear portion 72 of the high-refractive-index waveguide and a curved portion 73 of the high-refractive-index waveguide.

As indicated by the partial cross-sectional view in FIG. 4, the low-refractive-index waveguide 61 is composed of a laminate, which is formed by stacking optical waveguide layer A 53 on top of a right-hand convex of n-type InP 51. An underside electrode (not shown) is formed on the underside of the n-type InP 51. The present embodiment includes this underside electrode although it is not always necessary for the low-refractive-index waveguide 61. The low-refractive-index waveguide 61 is substantially uniform in width. However, the low-refractive-index waveguide 61 may have a laterally periodic, rectangular, plane pattern (a pattern in which the optical waveguide width periodically changes) along a wave guiding direction so that each of the right-hand convex of n-type InP 51 and optical waveguide layer A 53 is a long-period grating, as is the case with the high-refractive-index waveguide 60.

As indicated by the reference numerals 74 and 75 in FIG. 5, the low-refractive-index waveguide 61 is linear at the center of the lateral codirectional coupler type wavelength tunable filter (at the center of the low-refractive-index waveguide 61), positioned apart from the high-refractive-index waveguide 60 at the other end of the lateral codirectional coupler type wavelength tunable filter (at an end of the low-refractive-index waveguide 61), and curved in the direction of an increasing gap (positioned to gradually approach the high-refractive-index waveguide 60 toward the center) to have a planar layout. To indicate this planar layout, FIG. 5 shows a linear portion 75 of the low-refractive-index waveguide and a curved portion 74 of the low-refractive-index waveguide.

Further, the lateral codirectional coupler type wavelength tunable filter according to the present embodiment is configured so that semi-insulating InP 52 is formed to completely cover the low-refractive-index waveguide 61, which is short in height, and expose the upper mesa surface of the high-refractive-index waveguide 60, which is relatively tall. This semi-insulating InP 52 narrows a current path from an electrode 59 so that almost no current flows to the low-refractive-index waveguide 61.

The p-type InP 56 is placed on top of the high-refractive-index waveguide 60 and low-refractive-index waveguide 61 as a clad layer. However, as the semi-insulating InP 52 is already formed in contact with the low-refractive-index waveguide 61, the p-type InP 56 is placed over the low-refractive-index waveguide 61 with the semi-insulating InP 52 positioned in-between.

The electrode 59 is formed on the p-type InP 56. As indicated by the reference numeral 76 in FIG. 5, the plane pattern of the electrode 59 is slightly smaller than that of an InP substrate 71 (which corresponds to the n-type InP 51 in FIG. 4). The employed structure is such that the electrode 76 is completely surrounded by the InP substrate 71. Therefore, the resulting structure is such that the electrode does not cover the curved portion 73 of the high-refractive-index waveguide, the curved portion 74 of the low-refractive-index waveguide, an adjacent area between the linear portion 72 of the high-refractive-index waveguide and the curved portion 74 of the low-refractive-index waveguide, and an adjacent area between the linear portion 75 of the low-refractive-index waveguide and the curved portion 73 of the high-refractive-index waveguide. As no current is to flow to the low-refractive-index waveguide 61, the electrode 59 need not be formed to overlap with the low-refractive-index waveguide 61. In the present embodiment, however, the electrode 59 is formed to overlap with the low-refractive-index waveguide 61. It should be noted, however, that $SiO_2$ 58 is provided as an inorganic insulation film to provide increased current injection efficiency except for areas around the high-refractive-index waveguide 60 (a definite area directly above the high-refractive-index waveguide 60 and definite areas to the right and left of the high-refractive-index waveguide 60).

Figure 6A:
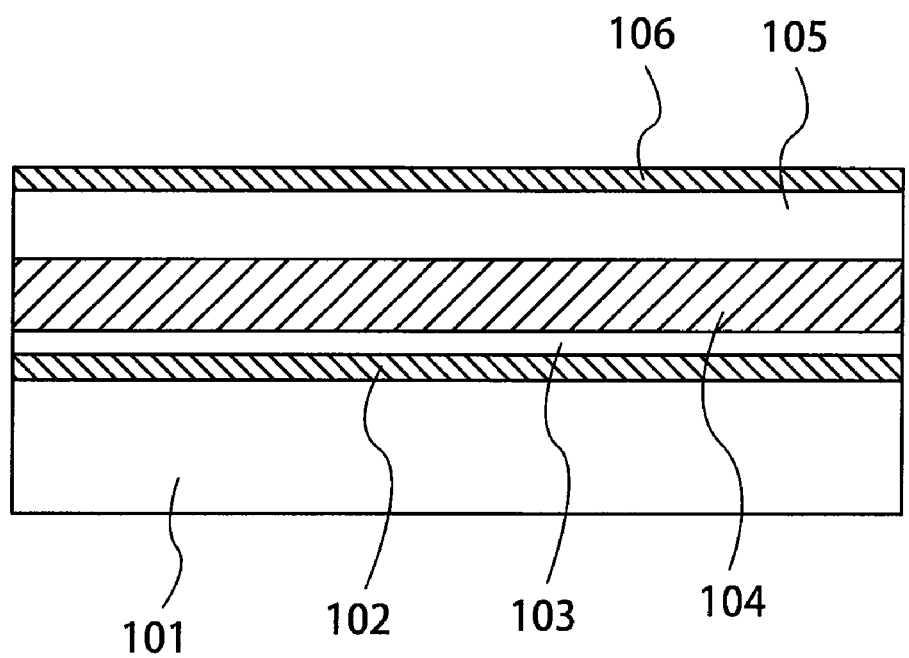
FIG. 6A is a flow diagram illustrating how a lateral codirectional coupler type wavelength tunable filter is manufactured.
Figure 6B:
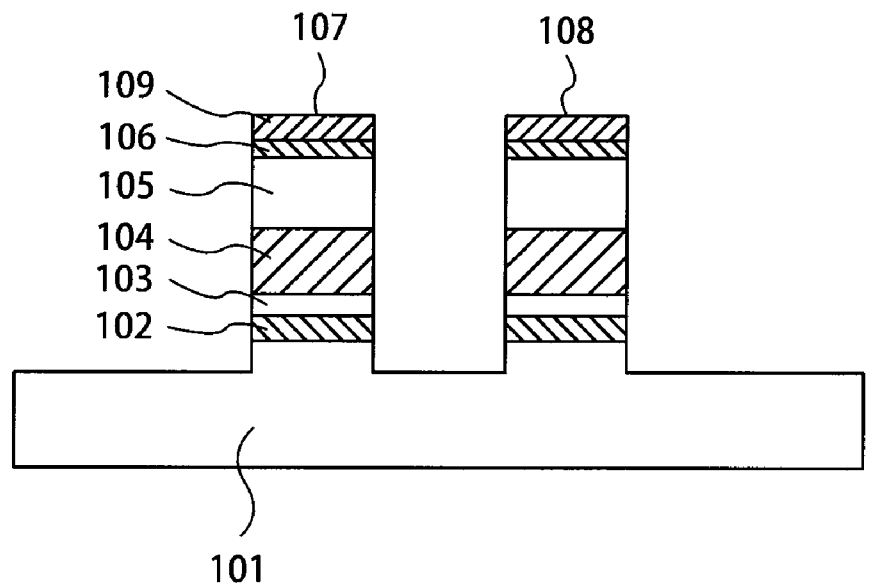
FIG. 6B is a flow diagram illustrating how a lateral codirectional coupler type wavelength tunable filter is manufactured.
Figure 6C:
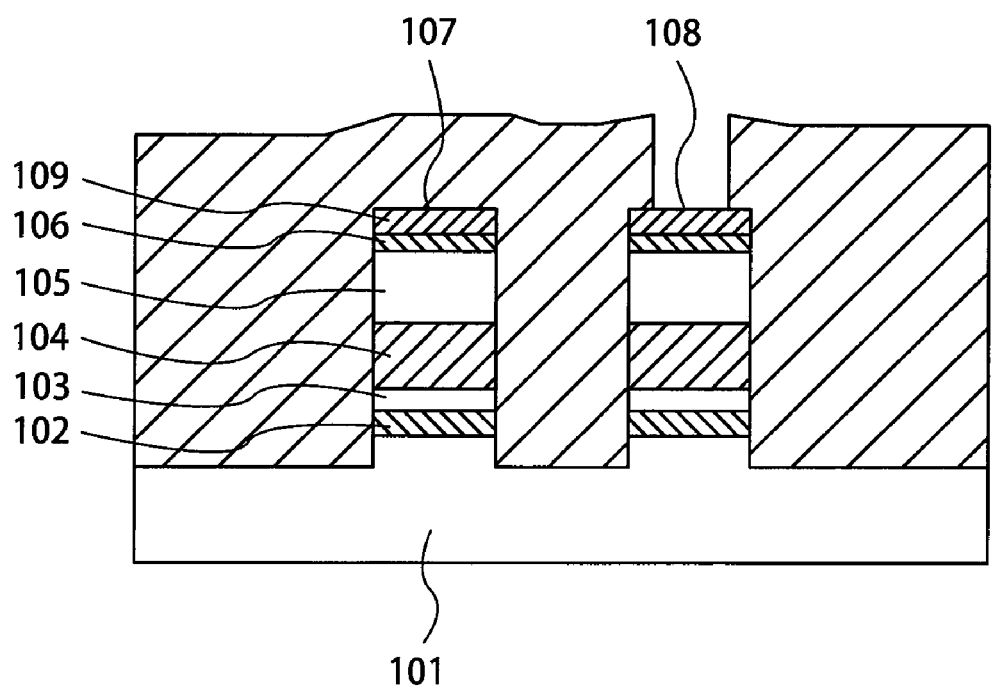
FIG. 6C is a flow diagram illustrating how a lateral codirectional coupler type wavelength tunable filter is manufactured.
Figure 6D:
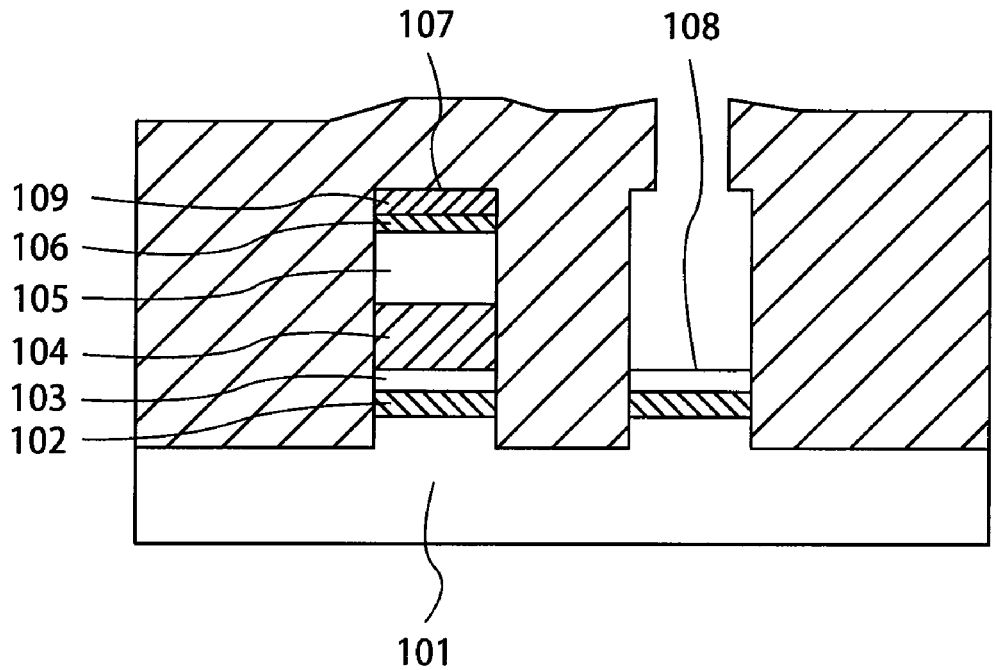
FIG. 6D is a flow diagram illustrating how a lateral codirectional coupler type wavelength tunable filter is manufactured.
Figure 6E:
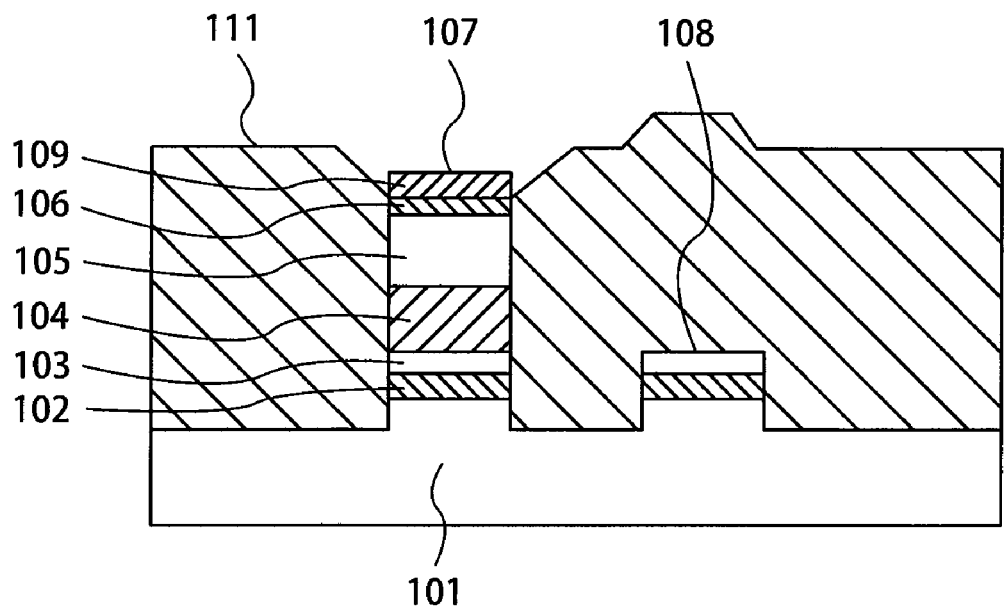
FIG. 6E is a flow diagram illustrating how a lateral codirectional coupler type wavelength tunable filter is manufactured.

A process of manufacturing the lateral codirectional coupler type wavelength tunable filter according to the present embodiment will now be described. This process is illustrated in FIG. 6 (6A to 6F). First of all, n-type InGaAsP having a compositional wavelength of 1.3 μm and a thickness of 100 nm (102), n-type InP having a thickness of 100 nm (103), InGaAsP having a compositional wavelength of 1.4 μm and a thickness of 350 nm (104), p-type InP having a thickness of 400 nm (105), and InGaAs having a thickness of 100 nm (106) are formed on the entire surface of an n-type InP substrate (101) by a known MOVPE method (FIG. 6A). The resulting multilayer InP wafer is then coated with a silicon dioxide film ($SiO_2$) 109 as a protective mask. The silicon dioxide mask is then used to perform etching until the n-type InP substrate (101) is reached so that mesa stripes composed of a laminate containing the n-type InGaAsP (102), n-type InP (103), InGaAsP (104), p-type InP (105), and InGaAs (106) are placed on a convex of the n-type InP substrate (FIG. 6B). A left-hand mesa stripe 107 is 1 μm in width. A right-hand mesa stripe 108 is 1 μm in width. The distance between the mesa stripes is 1 μm. For etching, a dry etching method such as a reactive ion etching (RIE) method based, for instance, on chlorine gas, a wet etching method based, for instance, on a bromine solution, or a combination of the above two methods may be used. Subsequently, the resulting surface is covered with a resist except for the right-hand mesa stripe (FIG. 6C). A core layer for the right-hand mesa stripe 108 is then formed by removing the silicon dioxide film 109 with buffered hydrofluoric acid, removing the p-type InGaAs 106 with a $H_3PO_4:H_2O_2:H_2O=1:1:10$ solution, removing the p-type InP 105 with a $HBr:H_3PO_4=1:4$ solution, and removing the InGaAsP film 104 with a $H_3PO_4:H_2O_2:H_2O=1:1:10$ solution (FIG. 6D). Next, the resist is removed. The semi-insulating InP is then regrown by using the MOVPE method (FIG. 6E). In this process, the layer of the tall high-refractive-index waveguide 72 is partly removed (the InGaAsP film 104 having a compositional wavelength of 1.4 μm, which serves as the core layer for the high-refractive-index waveguide 72, is removed). The remaining layer is used to form the InGaAsP low-refractive-index waveguide 102 having a compositional wavelength of 1.3 μm. Next, p-type InP 112 is grown on the entire surface by using the MOVPE method after removing the silicon dioxide film 109. A silicon dioxide film 113 and an electrode 114 are then formed to complete the filter (FIG. 6F). Referring to FIG. 6F, the high-refractive-index waveguide 72 corresponds to the left-hand mesa stripe 107, whereas the low-refractive-index waveguide 75 corresponds to the right-hand mesa stripe 108.

It is found that the lateral codirectional coupler type wavelength tunable filter according to the present embodiment is capable of controlling a transmittance peak wavelength within a wide wavelength range from 1.5 μm to 1.57 μm by controlling the amount of current injected from an electrode.

It is assumed that the present embodiment uses an InP substrate. However, a GaAs, GaN, or ZnSe substrate may alternatively be used.

Further, it is assumed that the present embodiment uses a laser whose oscillation wavelength is within a 1.55 μm band. However, a laser having a different wavelength band may alternatively be used.

Typical features of the lateral codirectional coupler type wavelength tunable filter according to the present embodiment will now be described.

The lateral codirectional coupler type wavelength tunable filter according to the present embodiment is structured so that an optical waveguide (n-type InP 54, optical waveguide layer B 55, p-type InP 56) is placed on either one of two mesa-striped optical waveguides (optical waveguide layer A 53 formed on the convex of the n-type InP 51), which are made of successively grown materials having the same compositional wavelength and the same film thickness. Therefore, a butt joint process, which is based on selective growth, need not be performed. Thus, the resultant structure assures high reproducibility so that the composition of an optical waveguide is not likely to suffer a partial change. Further, the high-refractive-index waveguide 60 can be implemented by forming it as a relatively tall layer unlike a layer formed as the low-refractive-index waveguide 61. Furthermore, the use of this structure makes it possible to form a plane pattern for two optical waveguides (high-refractive-index waveguide 72 and low-refractive-index waveguide 75) by performing only one photolithography process. Therefore, the distance between the two optical waveguides, which could not previously be decreased in consideration of optical waveguide positional displacement, can be decreased to 2 μm or less, or more specifically, to approximately 1 μm to permit proximity arrangement.

Moreover, the long-period grating 77 is implemented by periodic changes in the waveguide width. This makes it possible to accomplish patterning by performing only one photolithography process when the two optical waveguides (high-refractive-index waveguide 72 and low-refractive-index waveguide 75) are to be fabricated. Consequently, the positional displacement between the two optical waveguides can be avoided to provide consistent filtration characteristics.

In addition, although a current can be injected into the left-hand mesa stripe 107, no current is injected into the right-hand mesa stripe 108 because it is surrounded by semi-insulating InP 111. As a result, the wavelength to be filtered can be efficiently changed by means of current injection.

Second Embodiment

A second embodiment of the present invention will now be described with reference to FIGS. 7A, 7B, 8A, 8B, and 8C. The second embodiment is a wavelength tunable laser module based on a 1.55 μm band, lateral codirectional coupler type wavelength tunable filter mounted on an InP substrate.

Figure 7A:
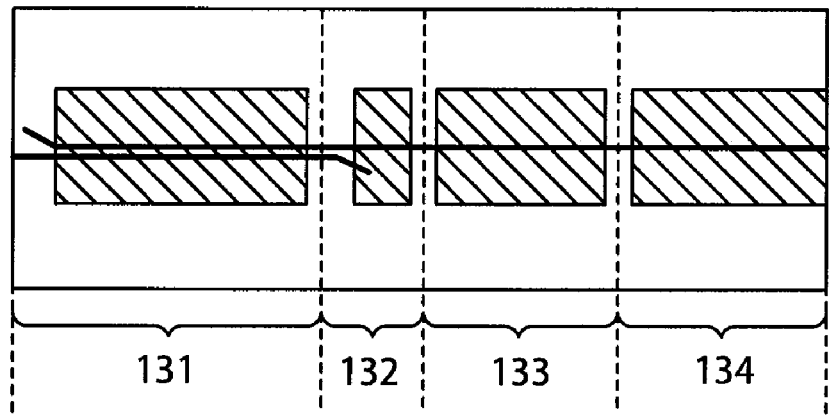
FIG. 7A is a diagram illustrating the configuration of a wavelength tunable laser module according to an embodiment of the present invention.
Figure 7B:
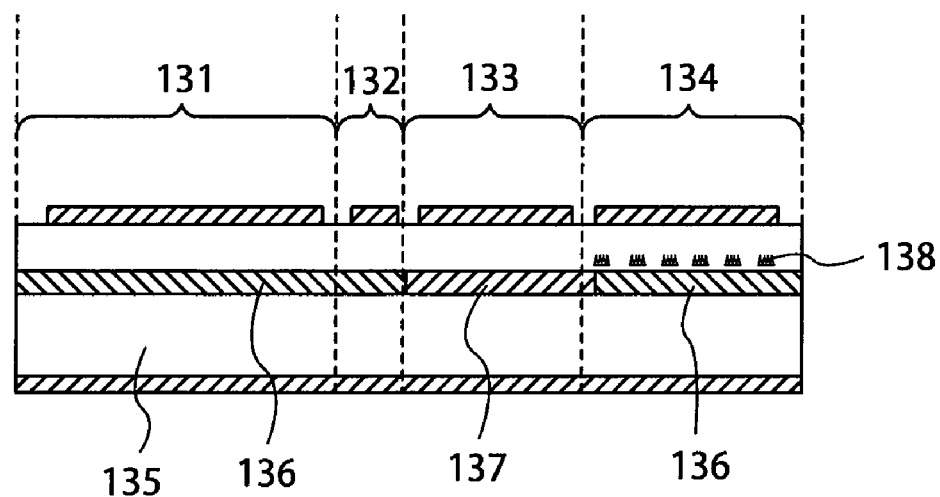
FIG. 7B is a diagram illustrating the configuration of a wavelength tunable laser module according to an embodiment of the present invention.

FIG. 7A is a top view illustrating the wavelength tunable laser module according to the present embodiment. The wavelength tunable laser module is configured so that it has a lateral codirectional coupler type wavelength tunable filter 131, a phase adjustment region 132, a gain region 133, and a reflector with grating structure 134. FIG. 7B is a cross-sectional view illustrating the wavelength tunable laser module according to the present embodiment. An optical waveguide layer 137, which generates a gain upon current injection, and another optical waveguide layer 136, whose refractive index changes upon current injection, are formed on an n-type InP substrate 135. The optical waveguide layer 137 serves as a core layer (gain layer) for the gain region 133. The optical waveguide layer 136 serves as a core layer for the lateral codirectional coupler type wavelength tunable filter 131, the phase adjustment region 132, and the reflector with grating structure 134. A grating 138 is formed in the reflector with grating structure 134. The optical waveguide layer 137 and the optical waveguide layer 136 are made of materials having different compositional wavelengths. A reflecting surface based on a cleaved facet is formed on the end faces of the wavelength tunable laser module, namely, the left-hand side of the lateral codirectional coupler type wavelength tunable filter 131 and the right-hand side of the reflector with grating structure 134 in FIG. 7A. However, the reflecting surface may alternatively be provided by a multilayer dielectric film. Here, it is assumed that the "reflecting surface of an end face" may be provided by either a cleaved facet or a multilayer dielectric film.

Figure 1:
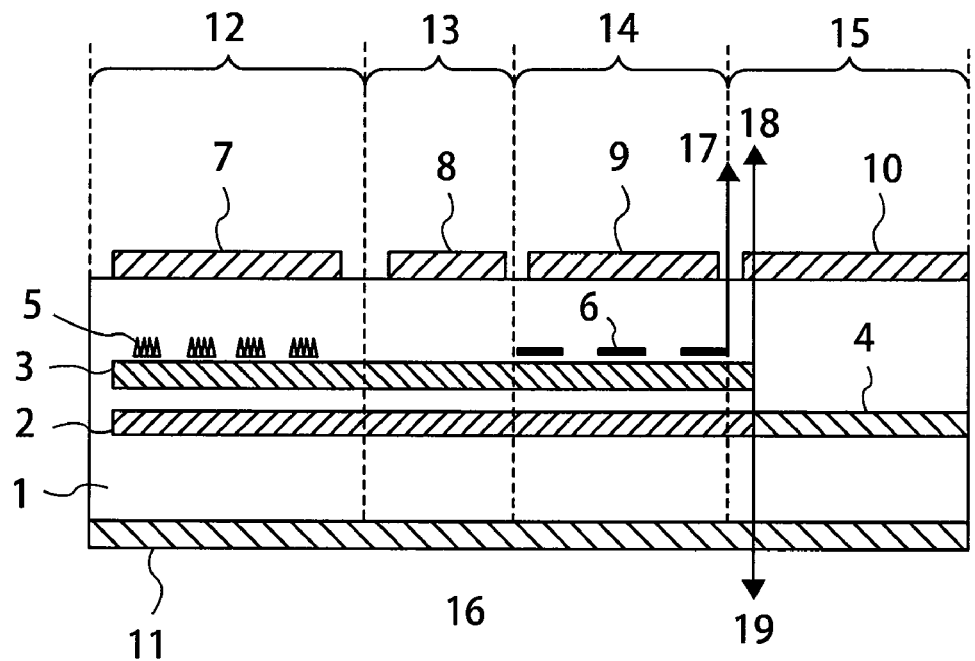
FIG. 1 is a cross-sectional view illustrating the structure of a typical conventional wavelength tunable laser (GCSR laser)
Figure 2:
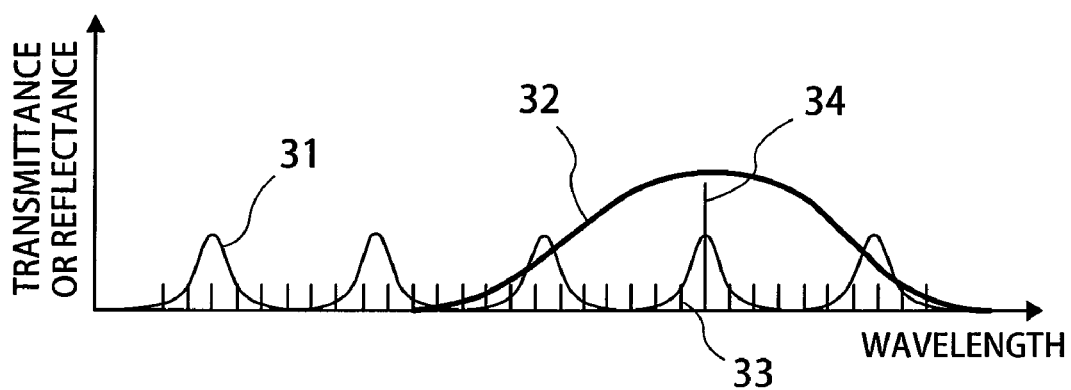
FIG. 2 is a diagram illustrating the operating principle of a GCSR laser.
Figure 3:
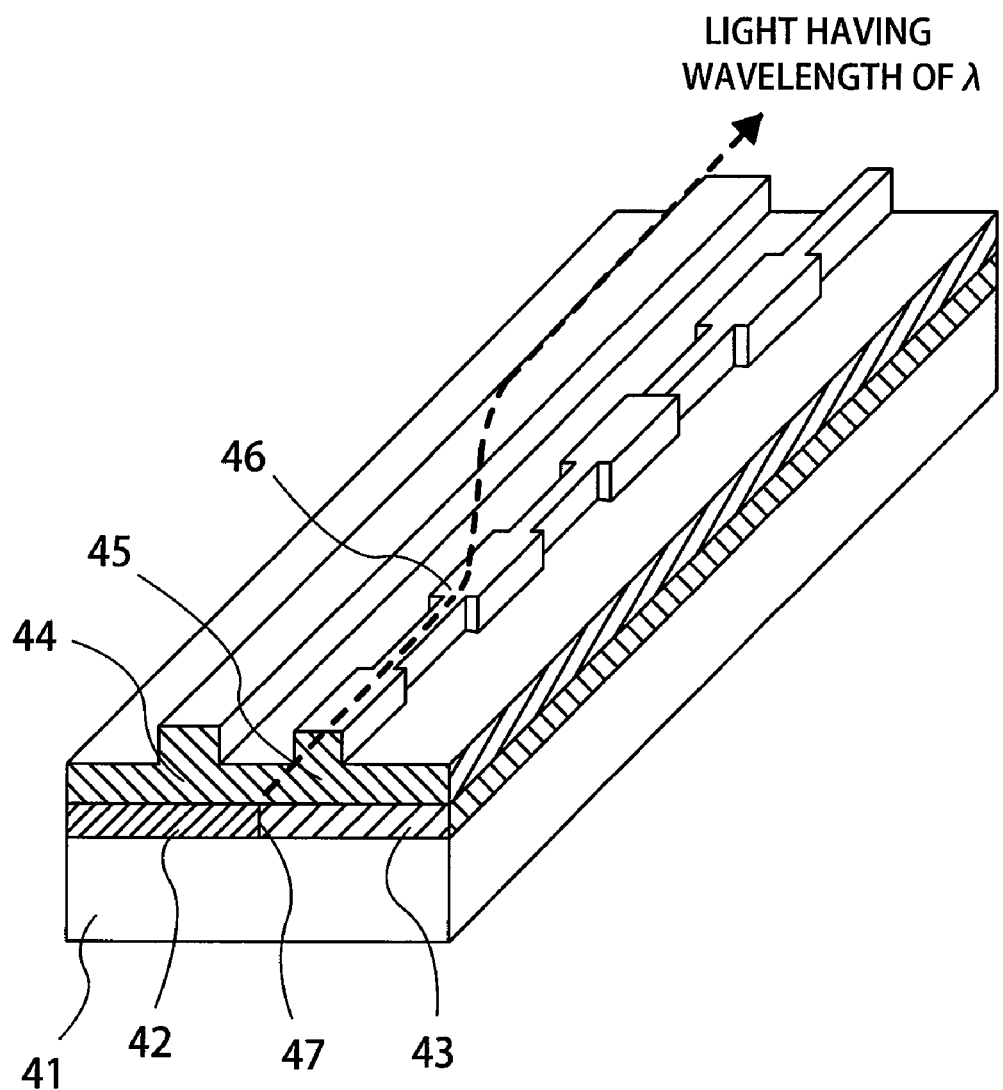
FIG. 3 is a bird's-eye view illustrating the structure of a conventional wavelength tunable filter.

The operating principle is as illustrated in FIG. 2. The oscillation wavelength is adjusted by causing a current flow in each region.

The configuration described herein is a wavelength tunable laser module having a gain region that is sandwiched between a first filter section and a second filter section, which differ in the filtering principle. The gain region emits light when a current is supplied to it. The first filter section and the second filter section can electrically control the peak wavelength of reflected light intensity. The first filter section has such filtration characteristics that there are multiple periodic peaks within a wavelength range in which the peak wavelength of the second filter section changes. Light transmitted through the first filter section or the second filter section is output from the wavelength tunable laser module. Particularly, as the second filter section includes a codirectional coupler type wavelength tunable filter and the reflecting surface of an end face, single-mode oscillation over a wide wavelength range can be achieved although it is not easily achieved by using a Mach-Zehnder interferometer filter described in Japanese Patent Application Laid-Open Publication No. 2000-223774. More specifically, single-mode oscillation can also be achieved even when the wavelength varies in the C band (a wavelength range from 1530 nm to 1570 nm).

The first filter section according to the present embodiment serves as a reflection filter whose reflection intensity peaks at a particular wavelength, and is composed of the reflector with grating structure 134 and the reflecting surface of an end face, which is an additional reflective film. However, it may alternatively be composed of a liquid-crystal etalon filter and the reflecting surface of an end face or composed of a ring resonator and the reflecting surface of an end face.

The configuration described above is preferred particularly when the reflector with grating structure 134 is used as the first filter section and the lateral codirectional coupler type wavelength tunable filter 131 is used as the second filter section. The reason is that the use of the above-described configuration simplifies the entire manufacturing process and efficiently achieves waveguide optical coupling although a regrowth process and a photolithography process need to be additionally performed when a conventional vertical codirectional coupler type wavelength tunable filter 131 is used.

Figure 8A:
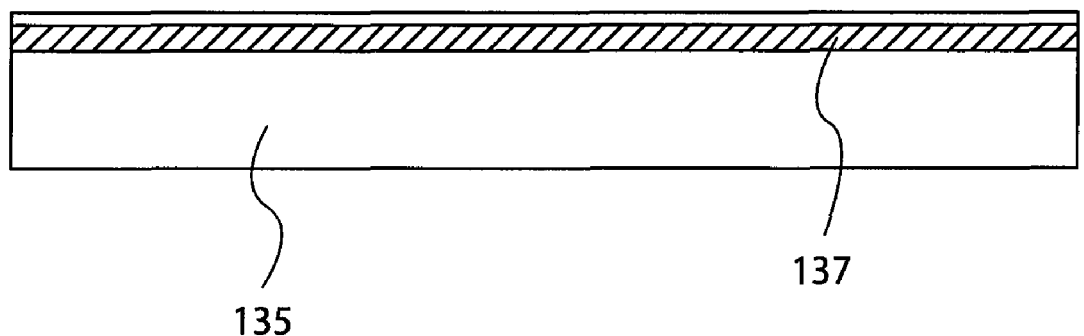
FIG. 8A is a process flow diagram illustrating a process of manufacturing a wavelength tunable laser module according to an embodiment of the present invention.
Figure 8B:
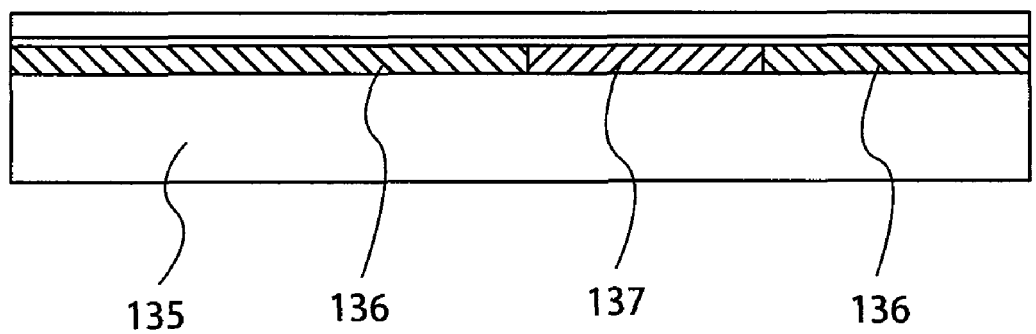
FIG. 8B is a process flow diagram illustrating a process of manufacturing a wavelength tunable laser module according to an embodiment of the present invention.
Figure 8C:
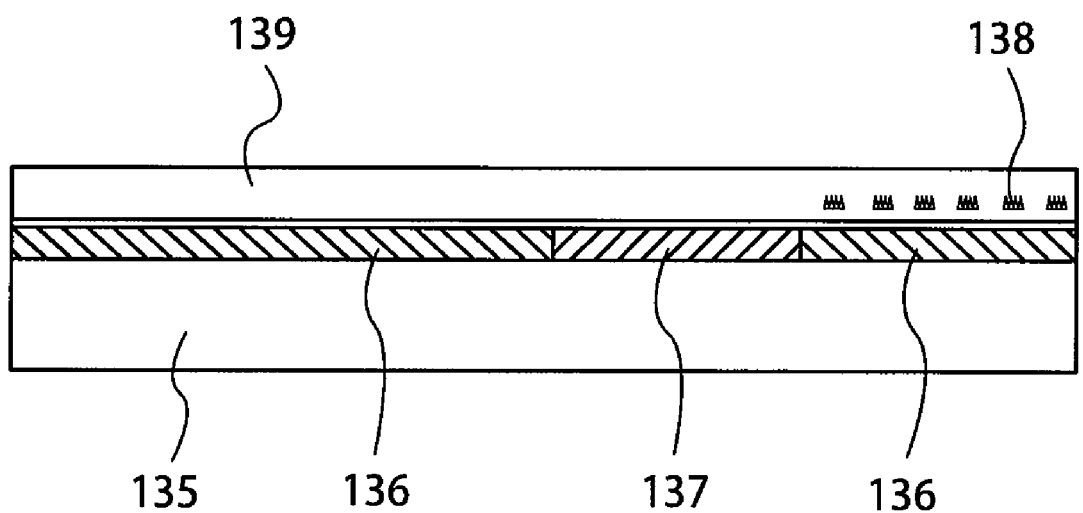
FIG. 8C is a process flow diagram illustrating a process of manufacturing a wavelength tunable laser module according to an embodiment of the present invention.

Referring to FIGS. 8A, 8B, and 8C, a method of manufacturing the wavelength tunable laser module will now be described. The optical waveguide layer 137 (gain layer), which functions as an active layer that generates a gain upon current injection, is formed on the n-type InP substrate 135 by using the MOVPE method (FIG. 8A). The optical waveguide layer 137 in a region other than the gain region 133 is then removed by performing reactive ion etching with silicon nitride used as a mask.

Next, the optical waveguide layer 136 whose refractive index changes upon current injection is selectively grown by using the MOVPE method (FIG. 8B). The grating 138 is then formed by an EB drawing method. Subsequently, p-type InP 139 is grown by using the MOVPE method to achieve wafer planarization (FIG. 8C). Next, after a mesa stripe is formed as described in conjunction with the first embodiment, an electrode is formed to complete the laser module (FIG. 7B). In this instance, the optical waveguide layer 137, which serves as a gain layer, and the optical waveguide layer 136 form a butt joint structure that is made of semiconductor materials having different compositions.

It is found that this laser module oscillates in a single mode within a wide wavelength range from 1.5 µm to 1.57 µm.

It is assumed that the present embodiment uses an InP substrate. However, a GaAs, GaN, or ZnSe substrate may alternatively be used. Further, although the present embodiment assumes that the wavelength band is limited to a 1.55 µm band, a different wavelength band may also be used.

It should be understood by those skilled in the art that various modifications, combinations, sub-combinations, and alterations may occur depending on design requirements and other factors insofar as they are within the scope of the appended claims or the equivalents thereof.

What is claimed is:

1. A wavelength tunable filter comprising:
    a semiconductor substrate;
    a first optical waveguide which is mounted on the semiconductor substrate and provided with a first core layer; and
    a second optical waveguide which is mounted on the semiconductor substrate and provided with a second core layer,
    wherein the first optical waveguide is positioned along the second optical waveguide in an in-plane direction of the semiconductor substrate,
    wherein a grating is formed in one or more of the optical waveguides,
    wherein the first core layer is positioned close to a p-type conductive semiconductor and an n-type conductive semiconductor and structured to be capable of injecting a current or applying a voltage,
    wherein the second core layer is positioned close to either the p-type conductive semiconductor or the n-type conductive semiconductor, and
    wherein the distance between the first optical waveguide and the second optical waveguide is longer at an end of the second optical waveguide than at the center thereof.

2. A wavelength tunable filter comprising:
    a semiconductor substrate having a first-type conductive semiconductor layer;
    a first optical waveguide; and
    a second optical waveguide, the first optical waveguide and the second optical waveguide being extended from a first side of the semiconductor substrate to an opposing second side thereof,
    wherein the first optical waveguide includes:
        a first grating,
        a first core layer placed over the first-type conductive semiconductor layer,
        a first electrode placed under the first-type conductive semiconductor layer,
        a second-type conductive semiconductor layer placed over the first core layer, and
        a second electrode placed over the second-type conductive semiconductor layer,
    wherein the second optical waveguide includes:
        a second core layer placed over the first-type conductive semiconductor layer, and
    wherein a current-blocking layer is placed between the second electrode and the second core layer.

3. The wavelength tunable filter according to claim 2, wherein the first core layer and the second core layer are made of materials having different compositional wavelengths.

4. A wavelength tunable laser module comprising:
    the wavelength tunable filter according to claim 2; and
    a gain region;
    wherein the gain region includes a gain layer that is placed over the first-type conductive semiconductor layer; and
    wherein the gain layer is made of a material that differs from the first core layer of the wavelength tunable filter in compositional wavelength.

5. A wavelength tunable filter comprising:
    a semiconductor substrate having a first-type conductive semiconductor layer;
    a first optical waveguide; and
    a second optical waveguide, where the first optical waveguide and the second optical waveguide are extended from a first side of the semiconductor substrate to an opposing second side thereof,
    wherein the first optical waveguide includes:
        a first grating,
        a first core layer placed over the first-type conductive semiconductor layer,
        a first electrode placed under the first-type conductive semiconductor layer,
        a second-type conductive semiconductor layer placed over the first core layer, and
        a second electrode placed over the second-type conductive semiconductor layer,
    wherein the second optical waveguide includes:
        a second core layer placed over the first-type conductive semiconductor layer,
    wherein a current-blocking layer is placed between the second electrode and the second core layer,
    wherein the first core layer and the second core layer are made of materials having different compositional wavelengths, and
    wherein the first-type conductive semiconductor layer placed under the first core layer includes a layer having the same composition and film thickness as a laminate that is composed of the second core layer and the first-type conductive semiconductor layer placed under the second core layer.

6. A wavelength tunable filter comprising:
    a semiconductor substrate having a first-type conductive semiconductor layer;
    a first optical waveguide; and
    a second optical waveguide, where the first optical waveguide and the second optical waveguide are extended from a first side of the semiconductor substrate to an opposing second side thereof,
    wherein the first optical waveguide includes:
        a first grating,
        a first core layer placed over the first-type conductive semiconductor layer,
        a first electrode placed under the first-type conductive semiconductor layer,
        a second-type conductive semiconductor layer placed over the first core layer, and
        a second electrode placed over the second-type conductive semiconductor layer,
    wherein the second optical waveguide includes:
        a second core layer placed over the first-type conductive semiconductor layer,
    wherein a current-blocking layer is placed between the second electrode and the second core layer, wherein the first core layer and the second core layer are made of materials having different compositional wavelengths, and wherein the first grating includes a structure that periodically changes the width of the first core layer.

7. A wavelength tunable filter comprising:
a semiconductor substrate having a first-type conductive semiconductor layer; a first optical waveguide; and
a second optical waveguide, where the first optical waveguide and the second optical waveguide are extended from a first side of the semiconductor substrate to an opposing second side thereof,
wherein the first optical waveguide includes:
a first grating,
a first core layer placed over the first-type conductive semiconductor layer,
a first electrode placed under the first-type conductive semiconductor layer,
a second-type conductive semiconductor layer placed over the first core layer, and
a second electrode placed over the second-type conductive semiconductor layer,
wherein the second optical waveguide includes:
a second core layer placed over the first-type conductive semiconductor layer,
wherein a current-blocking layer is placed between the second electrode and the second core layer, and
wherein the distance between the first core layer and the second core layer is longer at an end of the second core layer than at the center thereof.

* * * * *